United States Patent
Krumphals et al.

(10) Patent No.: US 12,010,787 B2
(45) Date of Patent: Jun. 11, 2024

(54) DEVICE HAVING AN ELECTROCERAMIC COMPONENT

(71) Applicant: TDK Electronics AG, Munich (DE)

(72) Inventors: Robert Krumphals, Deutschlandsberg (AT); Stefan Breuer, Graz (AT); Daniel Neuwirth, Vilshofen (DE); Thomas Koidl, Graz-Puntigam (AT)

(73) Assignee: TDK Electronics AG, Munich (DE)

( * ) Notice: Subject to any disclaimer, the term of this patent is extended or adjusted under 35 U.S.C. 154(b) by 251 days.

(21) Appl. No.: 17/635,124

(22) PCT Filed: Aug. 11, 2020

(86) PCT No.: PCT/EP2020/072480
§ 371 (c)(1),
(2) Date: Feb. 14, 2022

(87) PCT Pub. No.: WO2021/037550
PCT Pub. Date: Mar. 4, 2021

(65) Prior Publication Data
US 2022/0304134 A1    Sep. 22, 2022

(30) Foreign Application Priority Data
Aug. 27, 2019   (DE) .......................... 102019122939.1

(51) Int. Cl.
*H05H 1/24* (2006.01)
*H01L 41/047* (2006.01)
(Continued)

(52) U.S. Cl.
CPC .......... *H05H 1/2481* (2021.05); *H10N 30/40* (2023.02); *H05H 2240/10* (2013.01); *H05H 2240/20* (2013.01)

(58) Field of Classification Search
CPC ............ H05H 1/2481; H05H 2240/10; H05H 2240/20; H10N 30/40; H10N 30/875; H01L 41/107; H01L 41/047; H01L 41/053
See application file for complete search history.

(56) References Cited

U.S. PATENT DOCUMENTS

| | | | | |
|---|---|---|---|---|
| 6,639,174 B2 * | 10/2003 | Augeraud | ................ | H05H 1/34 219/121.48 |
| 2013/0294557 A1 * | 11/2013 | Perkins | .................... | G21G 4/02 376/115 |

(Continued)

FOREIGN PATENT DOCUMENTS

| | | |
|---|---|---|
| DE | 102010061946 A1 | 5/2012 |
| DE | 102016120324 A1 | 4/2018 |

(Continued)

OTHER PUBLICATIONS

International Search Report and Written Opinion of International Searching Authority corresponding to International Patent Application No. PCT/EP2020/072480, with English translation of International Search Report, dated Nov. 16, 2020 (10 pages).

*Primary Examiner* — Wei (Victor) Y Chan
(74) *Attorney, Agent, or Firm* — Nixon Peabody LLP

(57) ABSTRACT

A device including an electroceramic component having a first area and a second area, a potting compound at least partially surrounding the electroceramic component, and a sleeve-shaped housing which at least partially surrounds the potting compound. The housing has, in a first housing section that surrounds the potting compound in the first area of the electroceramic component, a material wherein the thermal conductivity of said material is greater than the thermal conductivity of a material of the housing in a second (Continued)

housing section. The housing in the second housing section surrounding the potting compound in the second area of the electroceramic component includes a non-conductive material.

19 Claims, 4 Drawing Sheets

(51) Int. Cl.
*H01L 41/107* (2006.01)
*H10N 30/40* (2023.01)

(56) References Cited

U.S. PATENT DOCUMENTS

| | | | |
|---|---|---|---|
| 2013/0341187 A1* | 12/2013 | Babel | G01N 27/4166 |
| | | | 204/406 |
| 2018/0368244 A1 | 12/2018 | Rinner | |
| 2020/0137865 A1 | 4/2020 | Pichler | |
| 2021/0111331 A1 | 4/2021 | Nettesheim | |

FOREIGN PATENT DOCUMENTS

| | | | |
|---|---|---|---|
| DE | 102018113190 A1 | 12/2019 | |
| SU | 594550 A1 | 2/1978 | |
| WO | WO 2018/167167 A1 | 9/2018 | |

* cited by examiner

DEVICE HAVING AN ELECTROCERAMIC COMPONENT

CROSS-REFERENCE TO RELATED APPLICATIONS

This application is a U.S. National Stage of International Application No. PCT/EP2020/072480, filed Aug. 11, 2020, which claims the benefit of German Patent Application No. 102019122939.1, filed Aug. 27, 2019, both of which are incorporated herein by reference in their entireties.

The present invention relates to a device comprising an electroceramic component. The electroceramic component may in particular be a piezoelectric transformer.

Piezoelectric transformers can be used for plasma generation. In this process, a low input voltage is transformed into a high voltage. The surrounding air can be ionised by the high electric fields and, thus, a plasma can be generated. Parasitic discharges, which can be caused, for example, by conductive objects in the vicinity of the piezoceramics and which can lead to damage to the component, can present a problem.

It is the object of the present invention to provide an improved device. The object is solved by a device according to claim 1.

A device is proposed which comprises an electroceramic component having a first area and a second area. The device comprises a potting compound which at least partially surrounds the electroceramic component. The device comprises a sleeve-shaped housing at least partially surrounding the potting compound. The housing comprises a first housing section and a second housing section. The first housing section surrounds the potting compound in the first area of the electroceramic component and comprises a material having a higher thermal conductivity than a material of the second housing section. The second housing section surrounds the potting compound in the second area of the electroceramic component and comprises a non-conductive material. The material of the first housing section has a good thermal conductivity. The material of the first housing section may be a metallic material.

The first area and the second area of the electroceramic component may have different requirements towards their housing. In particular, the first area may be a low voltage area and the second area may be a high voltage area. Accordingly, in the first area, the use of a housing section comprising a metallic material may be advantageous, since the metallic material has a high robustness for further processing and a high thermal conductivity. Heat generated in the first area of the electroceramic component can thus be effectively dissipated via the first housing section. Further contacting and mechanical connection to further components can also be easily enabled by a first housing section consisting of metallic material. The metallic material can be aluminum, for example.

In the second housing section, which surrounds the second area of the component, the use of a non-conductive material can be advantageous, since a non-conductive material does not negatively influence electrical fields that inevitably arise in a high voltage area. Also, ignitions of a plasma between the electroceramic component and the second housing section are avoided if the second housing section is made of a non-conductive material.

The electroceramic component may be a piezoelectric transformer, preferably used for ionisation of a process gas and for plasma generation.

The potting compound may comprise a non-conductive material, for example silicone. The potting compound may surround the electroceramic component in such a way that parasitic discharges on the side surfaces of the electroceramic component are avoided. The potting compound may be a soft, jelly-like compound. The electroceramic component can be encapsulated in the potting compound in such a way that the potting compound does not dampen vibrations of the electroceramic component, or at least only damps them slightly, since the potting compound has a high elasticity. Accordingly, the potting compound cannot seriously impair the efficiency of the component.

The non-conductive material of which the second housing section is made can be a plastic, Teflon, a glass or a ceramic. These materials offer the advantage that they do not seriously affect electric fields that may occur in the second area of the electroceramic component. Accordingly, the operation of the electroceramic component is not affected by the provision of the housing.

The sleeve-shaped housing may have a flat surface on an outer side facing away from the electroceramic component.

The material of the housing in the first housing section has a good thermal conductivity. It may be a metal, a metal alloy, a plastic with good thermal conductivity or a ceramic. For example, it may comprise copper, aluminum or iron.

The electroceramic component may protrude from the potting compound. For example, the electroceramic component may protrude from the potting compound over a length of between 0.5 mm and 5 mm, preferably the electroceramic component protrudes from the potting compound over a length of between 1 mm and 3 mm. In particular, an output side end face of the second area of the component may protrude from the potting compound. Plasma ignitions can occur on the end face. Since the end face is not covered by the potting compound, the plasma ignitions are not influenced by the potting compound. Alternatively, it is also possible to completely cover the electroceramic component with the potting compound.

The potting compound may cover the end face of the electroceramic component in the second area facing away from the first area. In some embodiments, the potting compound may be thinner on the end face than on the side faces of the electroceramic component. Plasma ignition may then occur through the potting compound by means of a dielectric barrier discharge.

The device may further comprise a vacuum chamber. The vacuum chamber may seal a treatment chamber, in which the device is arranged, from an environment of the device, wherein the treatment chamber has a pressure reduced to atmospheric pressure or vacuum. The reduced pressure can reduce an ignition field strength of the device. The ignition field strength can be defined as the field strength above which plasma ignition is possible. Plasma ignitions that occur at lower field strengths present a smaller mechanical load for the electroceramic component. Accordingly, the use of the vacuum chamber can increase the reliability and service life of the electroceramic component, as damage to the electroceramic component as a result of the occurring mechanical stresses is less frequent. Furthermore, the plasma characteristics of plasma ignitions in the vacuum chamber can change compared to plasma ignitions at atmospheric pressure. Instead of a punctiform plasma ignition at the corners of an output side end face, the plasma can be ignited over the entire surface of the output side end face.

The device may further comprise a contact wire via which the electroceramic component is electrically contacted. The contact wire can have at least one bend. A bend may be defined as a curvature of the contact wire in which the contact wire deviates from a straight line. The contact wire can be inherently stable so that the bend remains without the influence of external forces. The contact wire can be used to connect the electroceramic component to a further contact, for example a control circuit on a circuit board.

The device may have a cover that adjoins an end of the first housing section that faces away from the second housing section. The cover may be manufactured using a potting process. The material of the cover may be different from the material of the potting compound, and in particular may be harder than the material of the potting compound.

The at least one bend of the contact wire may be arranged within the cover, wherein the contact wire extends through the cover. This allows the contact wire to be secured in the cover in such a way that movement of the contact wire in the longitudinal direction from the cover is prevented. Tensile forces acting on the contact wire can thereby be absorbed by the cover, so that the cover can provide a strain relief that can protect the electroceramic component from tensile forces.

The device can have an area between the cover and the electroceramic component that is filled with a soft potting compound. This mechanically decouples the electroceramic component from the cover and reduces the damping of the vibrating electroceramic component.

The device may further comprise a capsule surrounding the second area of the electroceramic component. The capsule may encapsulate the second area of the electroceramic component. Material dislodged from the electroceramic component during a plasma ignition cannot leave the capsule and will be deposited on an inner surface of the capsule. The capsule can thereby prevent the material from contaminating a surface that is being processed by plasma. In particular, the material of the electroceramic component may be a lead-containing material.

The capsule may act as a dielectric barrier, with primary plasma ignition occurring between an end face of the electroceramic component and the inside of the capsule, and plasma ignition occurring from a dielectric barrier discharge on an outside of the capsule.

The capsule may be filled with a process gas. The process gas may be, for example, a noble gas or air. Alternatively or additionally, the capsule may have a pressure that is reduced from an atmospheric pressure or there may be a vacuum in the capsule. A reduced pressure or vacuum in the capsule reduces the ignition field strength for the primary plasma discharge. This can reduce mechanical stress on the electroceramic component and increase its lifetime and its reliability.

The device can have terminals for electrical contacting, the terminals being designed to be detachably fastened by means of a bayonet connection, a clamp connection or a plug connection. Through the terminals, an element for further contacting can be connected, for example, to the contact wires mentioned above. The contacts mentioned here in the form of bayonet, clamp or plug connections are each detachable, so that the device could be easily replaced.

The device may comprise a spring element arranged to exert a force that contributes to the separation of the further contacting. Accordingly, the spring element may facilitate separation of the contacting.

The electroceramic component may be a piezoelectric transformer.

According to another aspect, the present invention relates to a plasma generator comprising the device described above, wherein the electroceramic component is configured to generate a non-thermal atmospheric pressure plasma. The device may also be used as an ion generator or an ozone generator.

Preferred embodiments are described below with reference to the figures.

Figure 1:
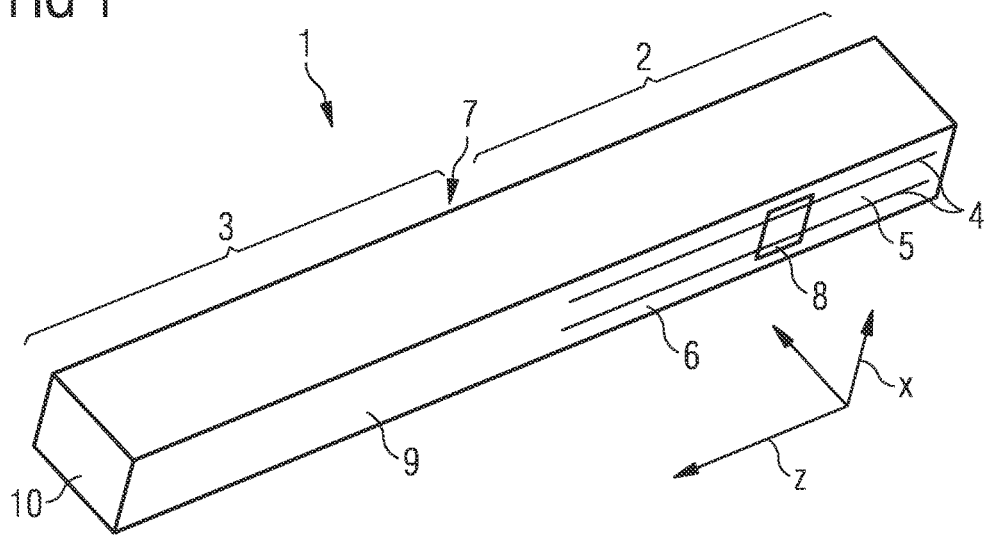
FIG. 1 shows an electroceramic component.

FIG. 1 shows an electroceramic component 1. The electroceramic component 1 is a piezoelectric transformer. The piezoelectric transformer can be used in particular as a plasma generator for generating non-thermal atmospheric pressure plasma.

A piezoelectric transformer is a design of a resonant transformer which is based on piezoelectricity and, in contrast to conventional magnetic transformers, is an electro-mechanical system. The piezoelectric transformer is, for example, a Rosen-type transformer.

The electroceramic component 1 has a first area 2, also referred to as the input area or the low voltage area, and a second area 3, also referred to as the output area or the high voltage area, the second area 3 joining the first area 2 in a longitudinal direction z. In the first area 2, the piezoelectric transformer 1 has electrodes 4 to which an AC voltage can be applied. The electrodes 4 extend in the longitudinal direction z of the piezoelectric transformer 1. The electrodes 4 are stacked alternately with a piezoelectric material 5 in a stacking direction x, which is perpendicular to the longitudinal direction z. The electrodes 4 are stacked alternately with a piezoelectric material 5. The piezoelectric material 5 is polarized in the stacking direction x.

The electrodes 4 are arranged inside the piezoelectric transformer 1 and are also referred to as internal electrodes. The piezoelectric transformer 1 has a first side surface 6 and a second side surface 7 opposite the first side surface 6. A first outer electrode 8 is arranged on the first side surface 6. A second outer electrode (not shown) is arranged on the second side surface 7. The inner electrodes 4 are electrically contacted alternately in stacking direction x with either the first outer electrode 8 or the second outer electrode.

The first area 2 can be controlled with a low AC voltage applied between the electrodes 4. Due to the piezoelectric effect, the AC voltage applied on the input side is first converted into a mechanical oscillation. The frequency of the mechanical oscillation is essentially dependent on the geometry and the mechanical structure of the electroceramic component 1.

The second area 3 has piezoelectric material 9 and is free of internal electrodes. The piezoelectric material 9 in the second area 3 is polarised in the longitudinal direction z. The piezoelectric material 9 of the second area 3 may be the same material as the piezoelectric material 5 of the first area 2, wherein the piezoelectric materials 5 and 9 may differ in their direction of polarisation. In the second area 3, the piezoelectric material 9 is formed into a single monolithic layer that is fully polarised in the longitudinal direction z. Thereby, the piezoelectric material 9 in the second area 3 has only a single direction of polarisation.

If an alternating voltage is applied to the electrodes 4 in the first area 2, a mechanical wave is formed within the piezoelectric material 5, 9, which generates an output voltage in the output area 3 due to the piezoelectric effect. The second area 3 has an output side end face 10. An electrical voltage is thus generated in the second area 3 between the end face 10 and the end of the electrodes 4 of the first area 2. A high voltage is generated at the output side end face 10. A high potential difference is also generated between the end face 10 on the output side and an environment of the electroceramic component 1, which is sufficient to generate a strong electric field that ionises a process gas.

In this way, the electroceramic component 1 generates high electric fields capable of ionising gases or liquids by electrical excitation. In the process, atoms or molecules of the respective gas or liquid are ionised and form a plasma. Ionisation always occurs when the electric field strength at the surface of the electroceramic component 1 exceeds the ignition field strength of the plasma. The ignition field strength of a plasma is the field strength required to ionise the atoms or molecules.

Figure 2:
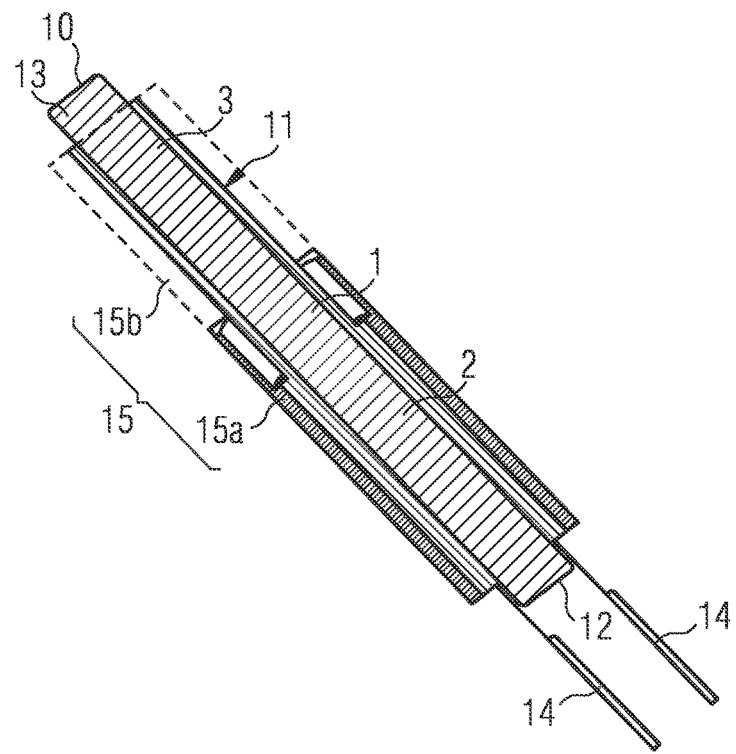
FIG. 2 shows a device comprising the electroceramic component shown in FIG. 1.

FIG. 2 shows a device which has the electroceramic component 1 shown in FIG. 1. The electroceramic component 1 is arranged in a potting compound 11 which largely surrounds the side surfaces of the component 1. A first end 12 of the electroceramic component 1, which is arranged in the first area 2 and faces away from the second area 3, projects beyond the potting compound 11. A second end 13 of the electroceramic component 1, which is arranged in the second area 3 and faces away from the first area 2, projects beyond the potting compound 11. In alternative embodiments, the first end 12 and/or the second end 13 of the electroceramic component 1 may also be covered with the potting compound 11.

The potting compound 11 comprises a non-conductive material. The potting compound 11 comprises a soft, jelly-like material. For example, the potting compound 11 may comprise or consist of silicone.

The potting compound 11 serves to prevent parasitic discharges on the side surfaces of the electroceramic component 1 by insulating the side surfaces from an environment through the potting compound 11. Furthermore, contact wires 14, via which the electroceramic component 1 can be electrically contacted, are also potted in the potting compound 11.

The device further comprises a housing 15 surrounding the potting compound 11. In the embodiment example shown in FIG. 2, the electroceramic component 1 is embedded together with the potting compound 11 in the housing 15 such that the first end 12 of the electroceramic component 1 and the second end 13 of the electroceramic component 1 project beyond the housing 15. In alternative embodiments, only one of the two ends 12, 13 may project beyond the housing 15 or the housing 15 may be flush with both ends 12, 13.

Alternatively, the housing 15 may protrude beyond the electroceramic component 1. For example, the housing 15 can project beyond the electroceramic component 1 in the first area 2, i.e. the low-voltage area. The housing 15 can thereby form a lateral border of a cover 17.

The housing 15 is sleeve-shaped. The housing 15 has a cylindrical opening extending through the housing 15. The cylindrical opening is dimensioned to receive the electroceramic component 1 and the potting compound 11 surrounding it, with the potting compound 11 in contact with an inner surface of the housing 15. The cylindrical inner contour of the housing 15 is not mandatory. Housings with a rectangular, square or elliptical cross-section and/or a rectangular, square or elliptical opening are also possible.

The housing 15 has a first housing section 15a and a second housing section 15b. The two housing sections 15a, 15b have different materials from each other. The first housing section 15a surrounds the potting compound 11 in the area where the potting compound 11 surrounds the first area 2 of the electroceramic component 1. The second housing section 15b surrounds the potting compound 11 in the area where the potting compound 11 surrounds the second area 3 of the electroceramic component 1.

The housing 15 is configured to protect and mechanically stabilize the potting compound 11. By choosing different materials for the first and second housing sections 15a, 15b, the housing sections 15a, 15b can be well adapted to the different requirements in the first and second areas 2, 3 of the electroceramic component 1.

The first housing portion 15a has a material with a high thermal conductivity. The material of the first housing region 15 may comprise a metal, a metal alloy, a plastic with good thermal conductivity or a ceramic. In particular, the housing 15 in the first housing region 15a may comprise aluminium or be made of aluminium. Heat may be generated in the first area 2 of the electroceramic device 1 due to ohmic losses and mechanical vibrations. Metal has a high thermal conductivity and is accordingly well suited to dissipate the heat generated in the first area 2 of the electroceramic component 1. In addition, metal has a high robustness which enables uncomplicated further processing and contacting of the first housing section 15a.

The second housing section 15b comprises a non-conductive material. For example, the second housing section 15b may be made of a plastic, Teflon, a glass or a ceramic. High electric field strengths may be generated in the second area 3 of the electroceramic component 1. Since the second housing section 15b is made of a non-conductive material, it does not influence the resulting electric field. If the second housing section 15b were made of a conductive material, undesirable plasma ignitions could occur from the component 1 to the second housing section 15b. Such plasma ignitions do not occur with a second housing section 15b made of a non-conductive material.

The device further comprises the two contact wires 14 mentioned above, each of the contact wires 14 being attached to one of the outer electrodes 8 of the electroceramic component 1. In particular, each of the contact wires 14 may be soldered to a respective one of the outer electrodes 8.

The contact wires 14 enable further contacting of the device. For example, the electroceramic component 1 can be electrically connected to a control circuit via the contact wires 14.

Figure 3:
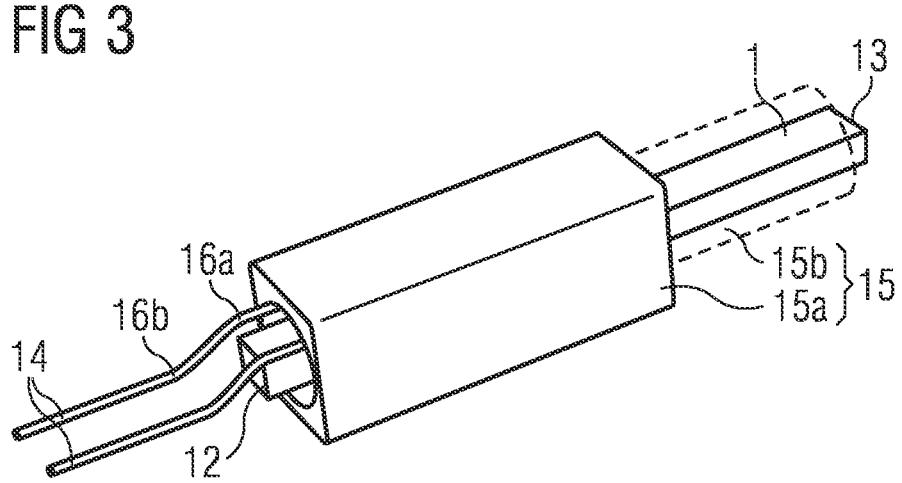
FIG. 3 shows a second embodiment of the device.

FIG. 3 shows a second embodiment of the device. Compared to the first embodiment example, the housing 15 has been changed in shape in the first housing section 15a. In cross-section, the housing 15 in the first housing section 15a is square. Thereby, the first housing section 15a has flat surfaces, which facilitates the mounting on a flat heat exchanger.

In the second embodiment shown in FIG. 3, the contact wires 14 also have two bends 16a, 16b. Within the potting compound 11, the contact wires 14 run in a straight line. In the area where the contact wires 14 emerge from the potting compound 11, they each have a first bend 16a. In the first bend 16a, the course of the contact wires 14 is changed by about 30°. Furthermore, the contact wires 14 have a second bend 16b, which is directed in an opposite direction and which is also a bend of about 30°.

Also in the second embodiment example, the electroceramic component 1 protrudes beyond the potting compound 11 and the housing 15 at both ends 12, 13. For example, the electroceramic component 1 may protrude beyond the housing 15 at one or both ends 12, 13 by a distance of 0.5 mm to 5 mm. In other embodiments, the electroceramic component 1 may be completely encased in the potting compound 11. The thermal conductivity of the potting compound 11 is worse than the thermal conductivity of the first housing section 15a, which is made of metal. The housing 15 is therefore constructed in such a way that the electroceramic component is only surrounded by a thin layer of the potting compound 11. The housing 15 has a circular recess in its interior in the first and second housing sections 15a, 15b. The diameter of the round recess is selected such that the electroceramic component 1 and the potting compound 11 can be arranged in the recess without the layer of potting compound 11 becoming too thick.

The second housing section 15b on the high voltage area can be made of Teflon, for example.

Figure 4:
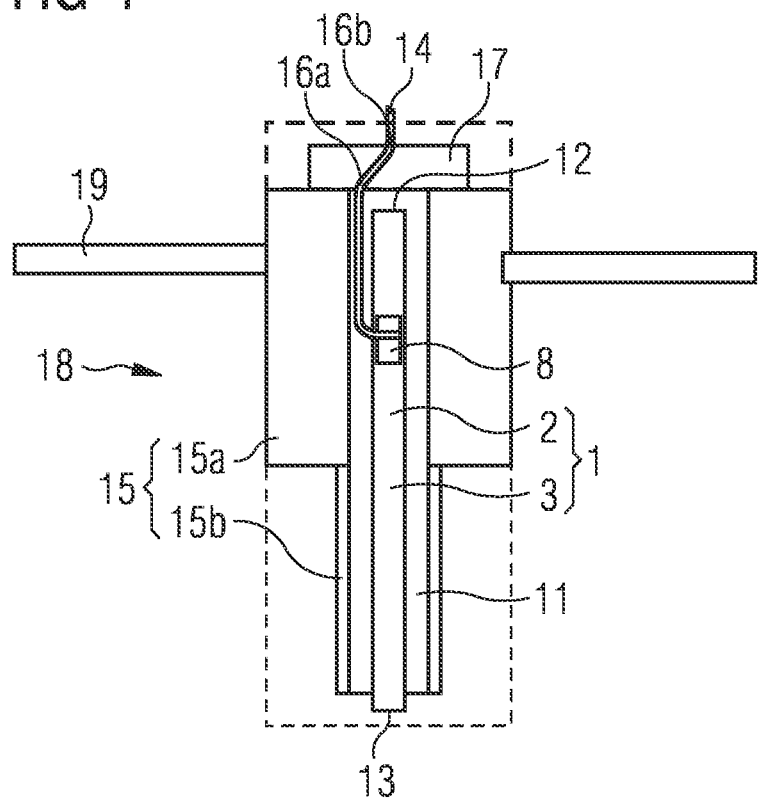
FIG. 4 shows a third embodiment of the device.

FIG. 4 shows a third embodiment of the device comprising an electroceramic component 1 of FIG. 1.

The device shown in FIG. 4 is based on the device shown in FIG. 3, with a cover 17 added to the first end 12 of the first housing section 15a. The cover 17 is produced by a moulding process. The cover 17 is made of a material which is harder than the material of the potting compound 11. The cover 17 may for example be made of an epoxy resin. In particular, the cover 17 surrounds the two bends 16a, 16b of the two contact wires 14. This additionally mechanically fixes the contact wires 14. A strain relief of the device is made possible by the cover 17. Tensile forces acting on the two contact wires 14 are absorbed in the cover 17 and do not act on the soldering points where the contact wires 14 are connected to the outer electrodes 8 of the electroceramic component 1. Accordingly, the component 1 is protected from damage by tensile forces. In addition, adhesion forces of the contact wires 14 within the potting compound 11 also contribute to a mechanical stabilisation of the device.

In the third embodiment, the device is further arranged in a vacuum chamber 18. In FIG. 4, the vacuum chamber 18 is indicated by a side wall 19 of the vacuum chamber 18. Inside the vacuum chamber 18 there is a pressure which is reduced compared to a pressure in an environment of the vacuum chamber 18, i.e. compared to atmospheric pressure. A vacuum may also be present within the vacuum chamber 18. The treatment space, which is processed by a non-thermal atmospheric pressure plasma generated by the electroceramic component 1, is located in the vacuum chamber 18.

In the vacuum chamber 18, the ignition voltage of the piezoelectric transformer decreases, so that plasma ignitions are already possible at lower voltages in the input and output regions. The relationship between the pressure present and the respective ignition voltage can be seen from the Paschen curve. Plasma ignitions at lower voltages represent a lower mechanical load for the electroceramic component 1. Accordingly, the service life of the component 1 can be extended by use in the vacuum chamber 18. As a result, the reliability of the device can be increased.

A further advantage of the reduced ignition voltage in a negative pressure is that plasma is not only ignited at the corners of the electroceramic component 1, but can be ignited over the entire output side end face 10. This means that a plasma cloud is now generated instead of point or beam-shaped plasma ignitions.

Figure 5:
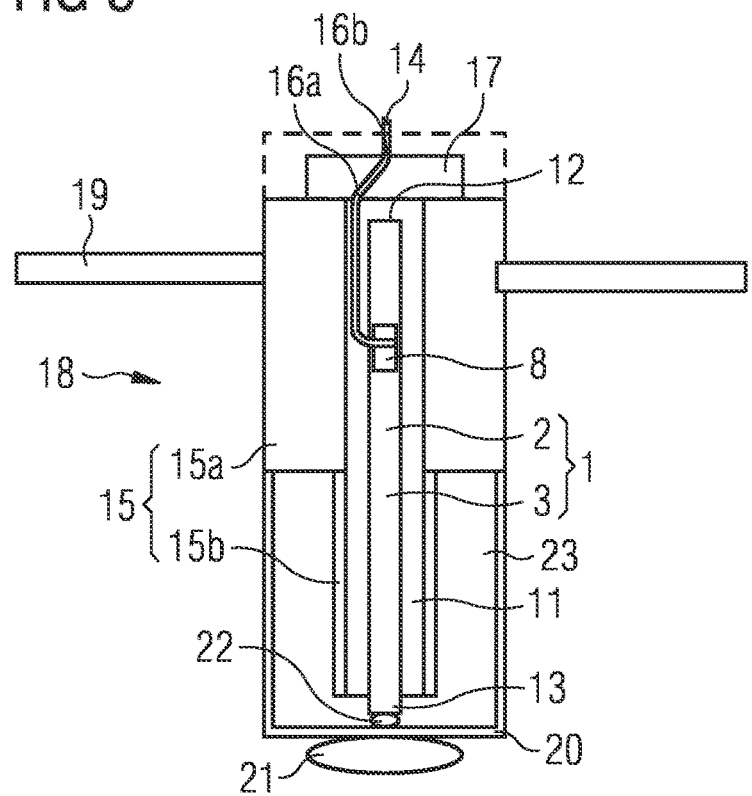
FIG. 5 shows a fourth embodiment of the device.

FIG. 5 shows a fourth embodiment of the device. The fourth embodiment is based on the third embodiment shown in FIG. 4, with the addition of a capsule 20 which surrounds the second area 3 of the electroceramic component 1. Air or a process gas is surrounded within the capsule 20. By using the capsule 20, which acts as a dielectric barrier, plasma ignitions 21 are made possible by the electrical barrier discharges. As indicated in FIG. 5, a primary plasma ignition 22 occurs between an output side end face 10 of the electroceramic component 1 and an inner wall of the capsule 20 and, as a result, plasma ignitions 21 also occur by dielectric barrier discharge in front of the capsule.

By using the capsule 20, contamination of an area to be treated can be avoided. During the plasma discharge, particles of material may be released from the electroceramic component 1. The material of the electroceramic component 1 may in particular contain lead. The use of the capsule 20 ensures that this lead-containing material does not deposit on a surface to be treated. Especially if the device is used for medical or cosmetic purposes, such material deposition must be avoided. The material will now deposit on the inner walls of the capsule 20. Furthermore, the capsule 20 allows for easy cleaning of the device. The capsule 20 may be made of an electrically non-conductive material, for example glass or alumina, or may be made of an electrically conductive material, for example stainless steel or aluminium. In the latter case, the capsule 20 must be insulated from the first housing section 15a.

In medical or cosmetic applications, the use of dielectric barrier discharges has the advantage over direct plasma ignition that a tissue to be treated is less stressed.

According to another embodiment, the gas chamber 23 in the capsule 20 may be filled with a process gas which is a noble gas, for example Ar, He or Ne. Alternatively or additionally, the gas chamber 23 may have a reduced pressure or even a vacuum. By reducing the pressure, the ignition voltage can be reduced. The area of the primary plasma discharge is increased by the negative pressure. The size of the area of the dielectric barrier discharge also increases. The vacuum in the gas chamber 23 of the capsule 20 can be combined with a vacuum in a vacuum chamber 18 in which the device is located.

Figure 6:
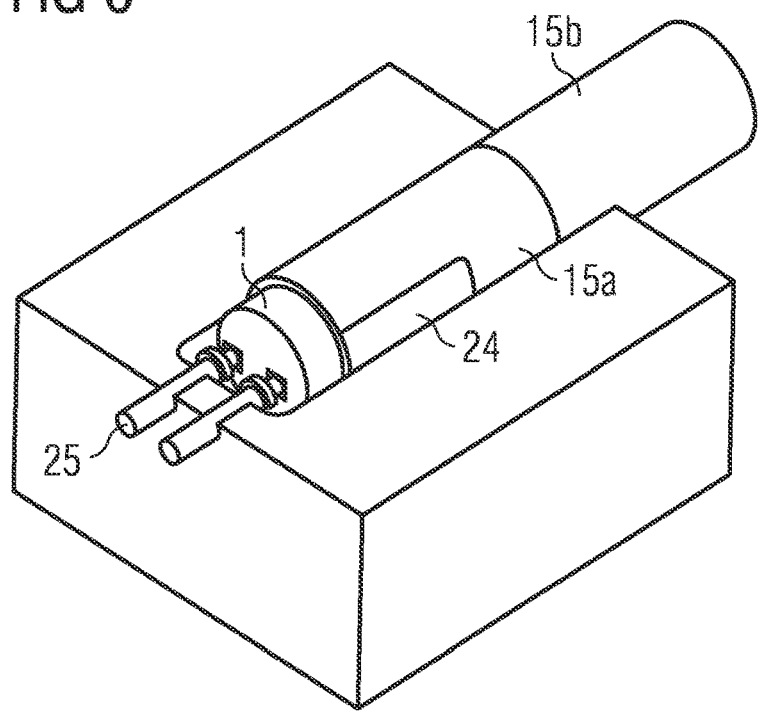
FIG. 6 shows a perspective view of the device.

FIG. 6 shows a perspective view of the device. In the device shown in FIG. 6, a recess 24 is provided in the housing 15 which can connect the housing 15 to a connection partner via a bayonet catch. When the housing 15 is connected to the connection partner, the contact wires 14 are connected to electrical contacts of the connection partner and in this way further contacting of the electroceramic component 1 can be produced.

The device further comprises spring elements 25, in particular spring pins, which are placed on the contact wires 14. The spring pins can be biased when the housing 15 is connected to the connection partner and can contribute to a release of the connection when the bayonet connection is opened.

Accordingly, the device can be easily connected to a further contact. This makes it possible to replace the device.

Figure 7:
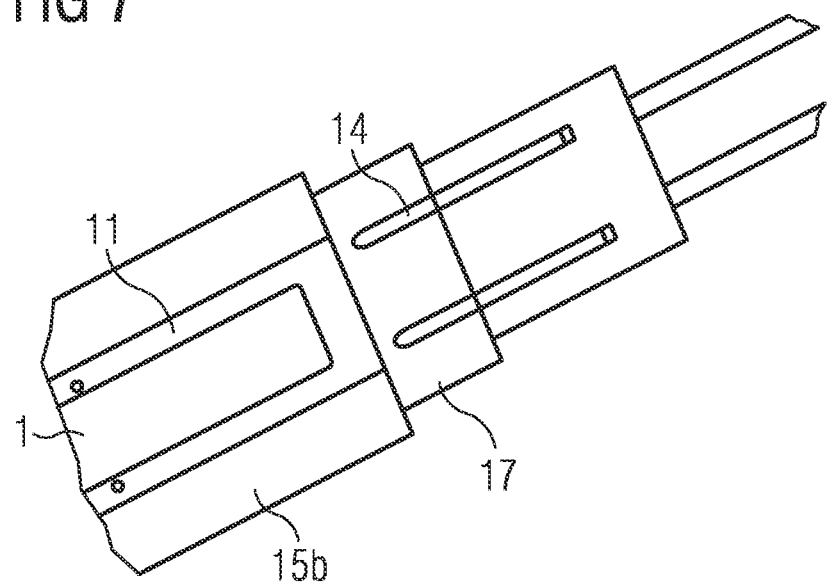
FIG. 7 shows the device and a connection partner in a connected state.
Figure 8:
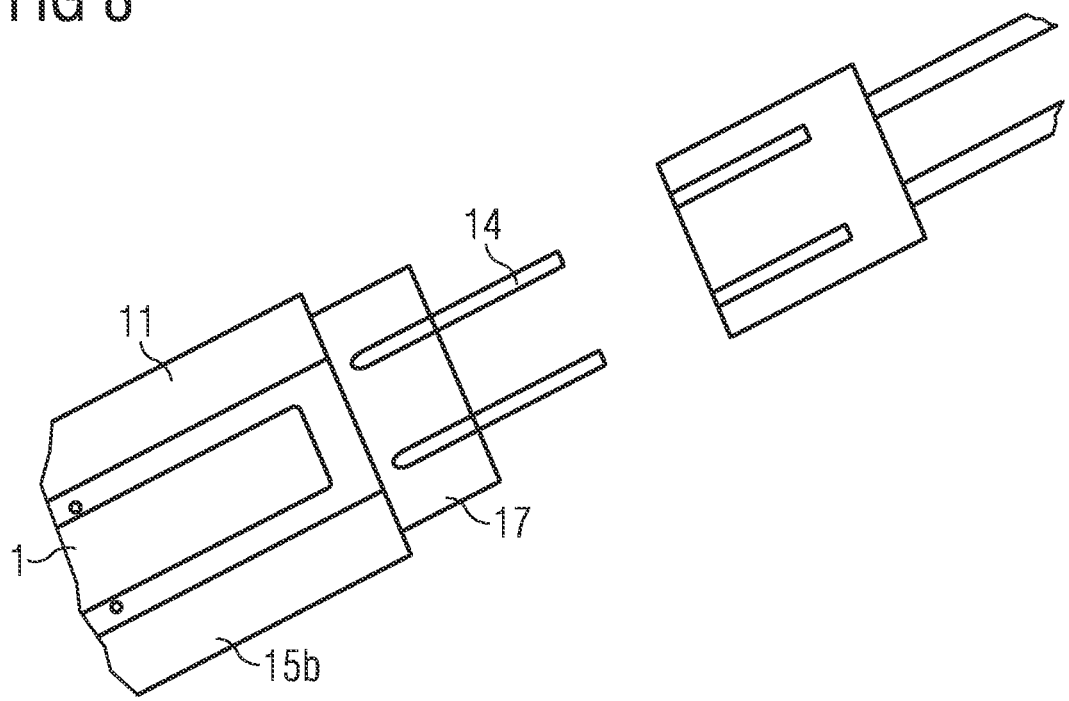
FIG. 8 shows the device and the connection partner in an unconnected state.

As an alternative to the bayonet connection shown in FIG. 6, the device can be connected to a connection partner by means of a plug-in connection. In FIG. 7 the connection partner is plugged onto the device and FIG. 8 shows the device and the connection partner in an unconnected state. The plug-in connection is an easily detachable connection that allows the device to be changed by an end user.

As an alternative to the bayonet connection or the plug-in connection, other mechanically detachable connections, for example clamping contacts, can also be used.

LIST OF REFERENCE SIGNS 1 electroceramic component
2 first area
3 second area
4 electrode
5 piezoelectric material
6 first side surface
7 second side surface
8 outer electrode
9 piezoelectric material
10 output side end face
11 potting compound
12 first end
13 second end
14 contact wire
15 housing
15a first housing section
15b second housing section
16a first bend
16b second bend
17 cover
18 Vacuum chamber
19 side wall
20 Capsule
21 plasma ignitions by the electrical barrier discharges
22 Primary plasma discharge
23 Gas chamber
24 recess
25 Spring element
x stacking direction
z longitudinal direction

The invention claimed is:

1. A device, comprising
an electroceramic component having a first area and a second area,
a potting compound which at least partially surrounds the electroceramic component, and
a sleeve-shaped housing which at least partially surrounds the potting compound, wherein the housing comprises, in a first housing section which surrounds the potting compound in the first area of the electroceramic component, a material the thermal conductivity of which is greater than the thermal conductivity of a material of the housing in a second housing section, and wherein the housing comprises a non-conductive material in the second housing section which surrounds the potting compound in the second area of the electroceramic component.

2. The device according to claim 1,
wherein the first area of the electroceramic component is a low voltage area, and
wherein the second area of the electroceramic component is a high voltage area.

3. The device according to claim 1,
wherein the non-conductive material is a plastic, Teflon, glass or ceramic.

4. The device according to claim 1,
wherein an outer surface of the sleeve-shaped housing facing away from the electroceramic component has a flat surface.

5. The device according to claim 1,
wherein the material of the housing in the first housing section is a metal, a metal alloy, a thermally good conducting plastic or a ceramic.

6. The device according to claim 1,
wherein the electroceramic component protrudes from the potting compound.

7. The device according to claim 1,
wherein the potting compound covers an end face of the electroceramic component in the second area facing away from the first area, wherein the potting compound is thinner on the end face than on lateral surfaces of the electroceramic component.

8. The device according to claim 1,
the device further comprising a vacuum chamber sealing a treatment space in which the device is arranged from an environment of the device, wherein a pressure reduced from atmospheric pressure or a vacuum is present in the treatment space.

9. The device according to claim 1,
the device further comprising a contact wire via which the electroceramic component is electrically contacted,
wherein the contact wire has at least one bend.

10. The device according to claim 1,
the device further comprising a cover adjoining an end of the first housing section facing away from the second housing section.

11. The device according to claim 10,
wherein the potting compound covers an end face of the electroceramic component in the first area facing away from the second area, and mechanically decouples the electroceramic component from the cover.

12. The device according to claim 11,
wherein the contact wire extends through the cover and the at least one bend of the contact wire is arranged inside the cover.

13. The device according to claim 11,
wherein the cover comprises a material which is harder than the potting compound.

14. The device according to claim 1,
the device further comprising a capsule surrounding the second area of the electroceramic component.

15. The device according to claim 4,
wherein the capsule is filled with a process gas,
and/or
wherein inside the capsule a pressure is reduced with respect to atmospheric pressure, or wherein inside the capsule a vacuum is present.

16. The device according to claim 1,
the device further comprising terminals for electrical further contacting of the device, wherein the terminals are adapted to be detachably fixed by means of a bayonet connection, a clamp connection or a plug connection.

17. The device according to claim 16,
the device further comprising a spring element arranged to exert a force which contributes to a separation of the further contacting.

18. The device according to claim 1,
wherein the electroceramic component is a piezoelectric transformer.

19. Plasma generator comprising a device according to claim 1, wherein the electroceramic component is configured to generate a non-thermal atmospheric pressure plasma.

* * * * *